United States Patent
Saha et al.

(10) Patent No.: US 8,560,768 B2
(45) Date of Patent: Oct. 15, 2013

(54) METHOD AND SYSTEM FOR REDUCING ENTRIES IN A CONTENT-ADDRESSABLE MEMORY

(75) Inventors: Arun Saha, Sunnyvale, CA (US); Bijendra Singh, Plano, TX (US)

(73) Assignee: Fujitsu Limited, Kawasaki-shi (JP)

( * ) Notice: Subject to any disclaimer, the term of this patent is extended or adjusted under 35 U.S.C. 154(b) by 330 days.

(21) Appl. No.: 12/952,050

(22) Filed: Nov. 22, 2010

(65) Prior Publication Data

US 2012/0131299 A1    May 24, 2012

(51) Int. Cl.
    *G06F 12/02*    (2006.01)
(52) U.S. Cl.
    USPC ............ 711/108; 711/170; 711/E12.017; 711/E12.018; 711/E12.002
(58) Field of Classification Search
    None
    See application file for complete search history.

(56) References Cited

U.S. PATENT DOCUMENTS

| | | | |
|---|---|---|---|
| 7,711,893 B1 * | 5/2010 | Venkatachary | 711/108 |
| 2004/0078516 A1 * | 4/2004 | Henderson et al. | 711/108 |
| 2005/0018683 A1 * | 1/2005 | Zhao et al. | 370/393 |
| 2010/0014526 A1 * | 1/2010 | Chavan et al. | 370/395.53 |
| 2010/0023726 A1 * | 1/2010 | Aviles | 711/216 |
| 2011/0219183 A1 * | 9/2011 | Sasso et al. | 711/108 |
| 2011/0249676 A1 * | 10/2011 | Singh et al. | 370/395.32 |
| 2012/0110411 A1 * | 5/2012 | Cheung et al. | 365/49.1 |

* cited by examiner

*Primary Examiner* — Michael Krofcheck
(74) *Attorney, Agent, or Firm* — Baker Botts L.L.P.

(57) ABSTRACT

A method for reducing memory entries in a ternary content-addressable memory may include determining if a first entry and a second entry are associated with the same data value. The method may also include determining if the first entry can be masked such that searching the memory with the content value of either of the first entry or the second entry returns the same data value. The method may further include, in response to determining that the first entry and a second entry are associated with the same data value and determining that the first entry can be masked such that addressing the memory with the content value of either of the first entry or the second entry returns the same data value: (i) masking the first entry such that addressing the memory with the content value of either of the first entry or the second entry returns the same data value; and (ii) deleting the second entry.

12 Claims, 4 Drawing Sheets

300

| ADDRESS | IDENTIFIER | MASK | DATA | |
|---|---|---|---|---|
| . | . | . | . | |
| . | . | . | . | |
| . | . | . | . ⟵302 | |
| 1001 | 0000-0001-0000 | 1111-1111-1111 | 50 ⟵304 | |
| 1002 | 0000-0001-0001 | 1111-1111-1111 | 50 ⟵306 | |
| 1003 | 0000-0001-0010 | 1111-1111-1111 | 50 ⟵308 | |
| 1004 | 0000-0001-0011 | 1111-1111-1111 | 50 | |
| . | . | . | . | |
| . | . | . | . | |
| . | . | . | . | |

| ADDRESS | IDENTIFIER | MASK | DATA |
|---|---|---|---|
| . | . | . | . |
| . | . | . | . |
| . | . | . | . |
| 1001 | 0000-0001-0000 | 1111-1111-1110 | 50 ⟵302 |
| 1002 | 0000-0001-0010 | 1111-1111-1110 | 50 ⟵306 |
| . | . | . | . |
| . | . | . | . |
| . | . | . | . |

| ADDRESS | IDENTIFIER | MASK | DATA |
|---|---|---|---|
| . | . | . | . |
| . | . | . | . |
| . | . | . | . |
| 1001 | 0000-0001-0000 | 1111-1111-1100 | 50 ⟵302 |
| . | . | . | . |
| . | . | . | . |
| . | . | . | . |

*FIG. 3C*

METHOD AND SYSTEM FOR REDUCING ENTRIES IN A CONTENT-ADDRESSABLE MEMORY

TECHNICAL FIELD OF THE INVENTION

The present invention relates generally to memory management and, more particularly, to a method and system for reducing entries in a content-addressable memory.

BACKGROUND

Networks are often used in telecommunications systems, cable television systems and data communication systems to convey information between remote points in the form of packets, frames, or other type of data structure. Networks often utilize virtual local area networks, or VLANs. A VLAN is a group of hosts (e.g., network elements or other computing systems) with a common set of requirements that communicate as if they were attached to the same local area network or broadcast domain, regardless of their physical location. A VLAN has the same attributes as a physical LAN, but it allows for end stations to be virtually grouped together even if they are not attached on the same network switch.

As a VLAN datagram (e.g., a packet or frame) is communicated through a network of various network elements, one or more of the various network elements may provide a service to the VLAN datagram. The service provided may be tied to a VLAN identifier (ID) contained in a datagram. When a datagram is received by a network element, the network element may determine the VLAN ID, and perform a lookup in a service lookup table that maps VLAN IDs to services. Based on the lookup, the network element may identify the service to be associated with the VLAN ID and the datagram.

A service lookup table is often implemented in a memory. Consequently, providing services to VLANs require consumption of entries in the memory. Because the number of entries in a memory is limited, there is a corresponding maximum number of services than can provided on a network element using traditional VLAN ID-to-service mapping approaches.

SUMMARY

In accordance with the present invention, disadvantages and problems associated with traditional approaches of mapping identifiers to services in a memory may be reduced or eliminated.

In accordance with embodiments of the present disclosure, a method for reducing memory entries in a ternary content-addressable memory may include determining if a first entry and a second entry are associated with the same data value. The method may also include determining if the first entry can be masked such that addressing the memory with the content value of either of the first entry or the second entry returns the same data value. The method may further include, in response to determining that the first entry and a second entry are associated with the same data value and determining that the first entry can be masked such that addressing the memory with the content value of either of the first entry or the second entry returns the same data value: (i) masking the first entry such that addressing the memory with the content value of either of the first entry or the second entry returns the same data value; and (ii) deleting the second entry.

Certain embodiments of the invention may provide one or more technical advantages. For example, methods and systems disclosed herein may provide for reduction of ternary content-addressable memory entries without reducing the number of addresses (e.g., services) that may be addressed. Thus, in a network element, the same number of services can be offered with a smaller value of memory, or a greater number of services can be offered with the same value of memory.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which:

FIGS. 3A and 3B illustrate example snapshots from intermediate phases of computation of a memory entry reduction method, in accordance with embodiments of the present disclosure;

FIG. 3C illustrates example contents of a lookup table as a result of a memory entry reduction method, in accordance with embodiments of the present disclosure.

DETAILED DESCRIPTION

Embodiments of the present invention and its advantages are best understood by referring to FIGS. 1-4, like numerals being used for like and corresponding parts of the various drawings.

Figure 1:
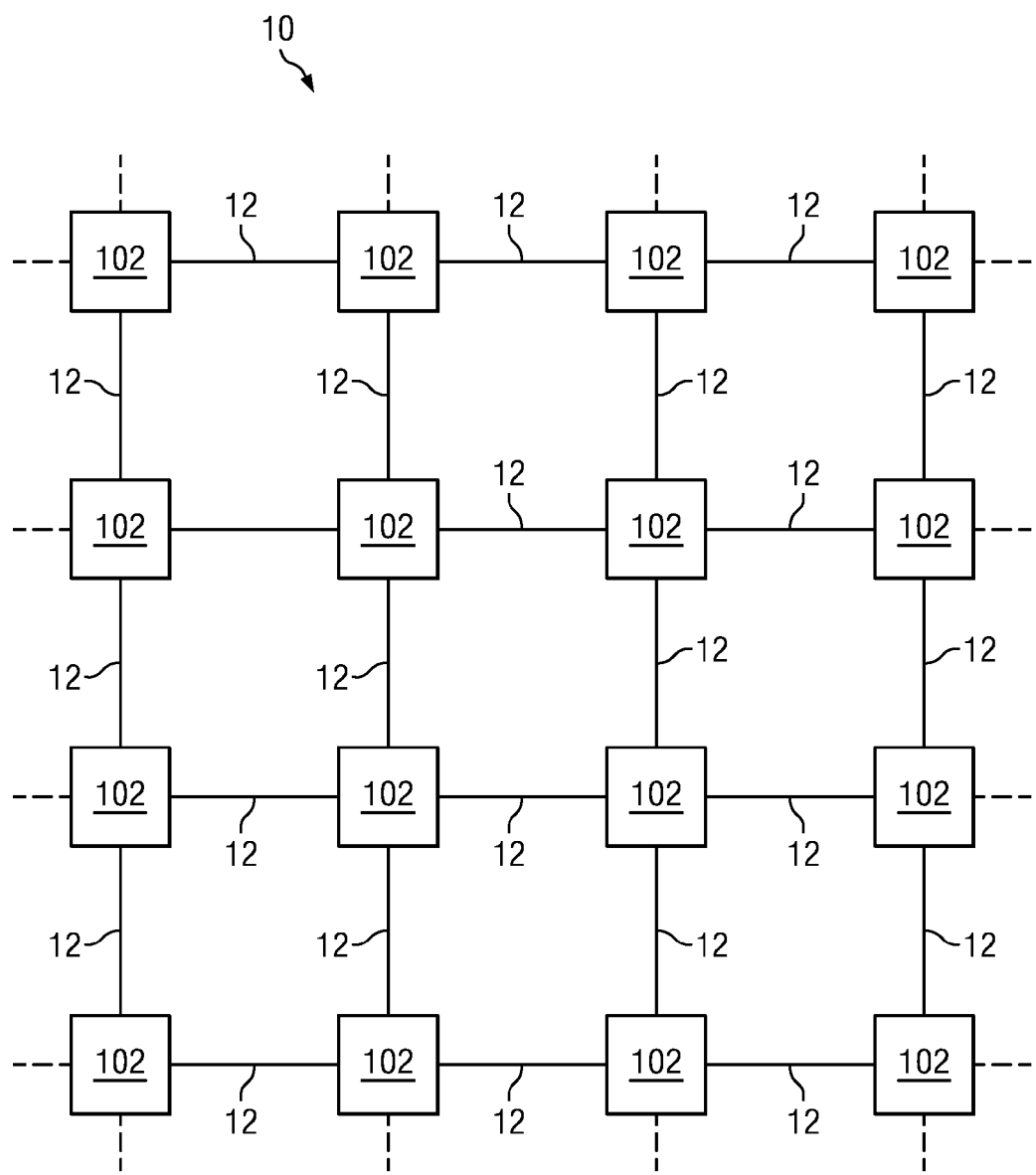
FIG. 1 illustrates a block diagram of an example network, in accordance with embodiments of the present disclosure.

FIG. 1 illustrates a block diagram of an example network 10, in accordance with certain embodiments of the present disclosure. In certain embodiments, network 10 may be an Ethernet network. Network 10 may include one or more transmission media 12 operable to transport one or more signals communicated by components of network 10. The components of network 10, coupled together by transmission media 12, may include a plurality of network elements 102. In the illustrated network 10, each network element 102 is coupled to four other nodes to create a mesh. However, any suitable configuration of any suitable number of network elements 102 may create network 10. Although network 10 is shown as a mesh network, network 10 may also be configured as a ring network, a point-to-point network, or any other suitable network or combination of networks. Network 10 may be used in a short-haul metropolitan network, a long-haul inter-city network, or any other suitable network or combination of networks. Network 10 may represent all or a portion of a short-haul metropolitan network, a long-haul inter-city network, and/or any other suitable network or combination of networks.

Each transmission medium 12 may include any system, device, or apparatus configured to communicatively couple network devices 102 to each other and communicate information between corresponding network devices 102. For example, a transmission medium 12 may include an optical fiber, an Ethernet cable, a T1 cable, copper cable, a WiFi signal, a Bluetooth signal, or other suitable medium.

Network 10 may communicate information or "traffic" over transmission media 12. As used herein, "traffic" means information transmitted, stored, or sorted in network 10. Such traffic may comprise optical or electrical signals configured to encode audio, video, textual, and/or any other suitable data. The data may be real-time or non-real-time. Traffic may be communicated via any suitable communications protocol, including, without limitation, the Open Systems Interconnection (OSI) standard and Internet Protocol (IP). Additionally, the traffic communicated in network 10 may be structured in any appropriate manner including, but not limited to, being structured in frames, packets, or an unstructured bit stream. As used herein, the term "datagram" will be used to generally referred to any data structure used to convey traffic, including without limitation a packet, a frame, an unstructured bit stream, or any other suitable data structure.

Each network element 102 in network 10 may comprise any suitable system operable to transmit and receive traffic. In the illustrated embodiment, each network element 102 may be operable to transmit traffic directly to one or more other network elements 102 and receive traffic directly from the one or more other network elements 102. Network elements 102 will be discussed in more detail below with respect to FIG. 2.

Modifications, additions, or omissions may be made to network 10 without departing from the scope of the disclosure. The components and elements of network 10 described may be integrated or separated according to particular needs. Moreover, the operations of network 10 may be performed by more, fewer, or other components.

Figure 2:
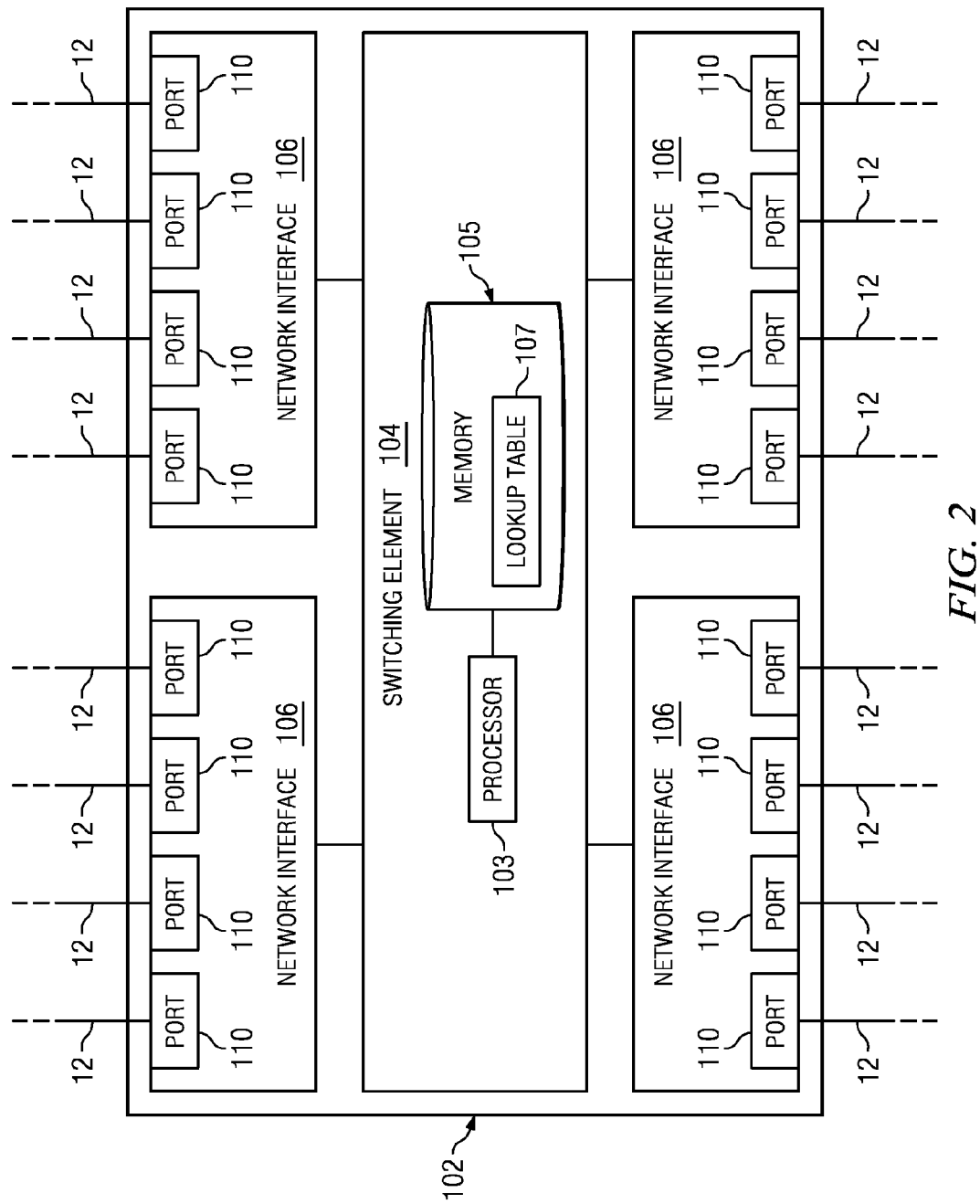
FIG. 2 illustrates a block diagram an example network element, in accordance with embodiments of the present disclosure.

FIG. 2 illustrates a block diagram an example network element 102, in accordance with certain embodiments of the present disclosure. As discussed above, each network element 102 may be coupled to one or more other network elements 102 via one or more transmission media 12. In some embodiments, however, not all network elements 102 may be directly coupled as shown in FIG. 2. Each network element 102 may generally be configured to receive data from and/or transmit data to one or more other network elements 102. In certain embodiments, network element 102 may comprise a switch or router configured to transmit data received by network element 102 to another device (e.g., another network element 102) coupled to network element 102.

As depicted in FIG. 2, network element 102 may include a switching element 104, and one or more network interfaces 106 communicatively coupled to switching element 104.

Switching element 104 may include any suitable system, apparatus, or device configured to receive traffic via a port 110 and forward such traffic to a particular network interface 106 and/or port 110 based on analyzing the contents of the datagrams carrying the traffic and/or based on a characteristic of a signal carrying the datagrams (e.g., a wavelength and/or modulation of the signal). For example, in certain embodiments, a switching element 104 may include a switch fabric (SWF). As depicted in FIG. 2, switching element 104 may include a processor 103 and a memory 105.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 105 and/or another component of network element 102.

Although FIG. 2 depicts processor 103 as a subcomponent of switch 104, in some embodiments one or more processors 103 may reside on network interfaces 106 and/or other components of network elements 102.

Memory 105 may be communicatively coupled to processor 103 and may include any system, device, or apparatus configured to retain program instructions and/or data for a period of time (e.g., computer-readable media). Memory 105 may include random access memory (RAM), electrically erasable programmable read-only memory (EEPROM), a PCMCIA card, flash memory, magnetic storage, opto-magnetic storage, or any suitable selection and/or array of volatile or non-volatile memory that may retain data after power to network element 102 is turned off. In certain embodiments, memory 105 may comprise a ternary content-addressable memory (TCAM). Although FIG. 2 depicts memory 105 as a subcomponent of switch 104, in some embodiments one or more memories 105 may reside on network interfaces 106 and/or other components of network element 102.

As shown in FIG. 2, memory 105 may include a lookup table 107. Lookup table 107 may include a table, map, database, or other data structure for associating one or more VLAN IDs with one or more services.

Each network interface 106 may be communicatively coupled to switching element 104 and may include any suitable system, apparatus, or device configured to serve as an interface between a network element 102 and a transmission medium 12. Each network interface 106 may enable its associated network element 102 to communicate to other network elements 102 using any suitable transmission protocol and/or standard. Network interface 106 and its various components may be implemented using hardware, software, or any combination thereof For example, in certain embodiments, one or more network interfaces 106 may include a network interface card. In the same or alternative embodiments, one or more network interfaces 106 may include a line card.

As depicted in FIG. 2, each of network interfaces 106 may include one or more physical ports 110. Each physical port 110 may include any system, device or apparatus configured to serve as a physical interface between a corresponding transmission medium 12 and network interface 106. For example, a physical port 110 may comprise an Ethernet port, an optical port, or any other suitable port.

FIGS. 3A and 3B illustrate example snapshots from intermediate phases of computation of a memory entry reduction method 400, in accordance with embodiments of the present disclosure. FIG. 3C illustrates example contents of a memory 300 as a result of memory entry reduction method 400, in accordance with embodiments of the present disclosure. FIG. 3A depicts example snapshots prior to application of memory entry reduction method 400. As shown in FIG. 3A, memory 300 may include one or more entries, including entries 302, 304, 306, and 308. Each entry located at unique address of the TCAM may include an identifier as its content, a mask associated with the identifier, and data associated with the identifier. In some embodiments, lookup table 107 may be implemented as a memory similar or identical to memory 300 depicted in FIG. 3. In these embodiments, an identifier may correspond to a VLAN ID and data associated with such identifier may correspond to a service identifier associated with the VLAN ID.

As is known in the art, a TCAM may be searched using a search key. Upon receipt of a search key, the TCAM may determine the lowest address A in the TCAM such that KEY & MASK=CONTENT & MASK, where KEY is the value of the search key, CONTENT is the value of the content of a particular TCAM entry at the address A, MASK is the value of the mask associated with the particular TCAM entry at the address A, and "&" represents a bitwise AND operation. Accordingly, as is also known in the art, a value of "0" in a particular bit position of a mask value indicates that the corresponding bit position of the content is a logical "don't care." Thus, as an example, a key value of 0100-0001-0111 would match a TCAM entry with a content value of 0100-0001-0100 and mask value of 1111-1111-1100 and would also match a TCAM entry with a content value of 0100-0001-0111 and a mask value of 1111-1111-1110.

In accordance with the present disclosure, a plurality of identifiers may be "bundled" such that a single memory 300 entry may represent a plurality of identifiers all associated with the same data, thus reducing the number of entries in memory 300.

Figure 4:
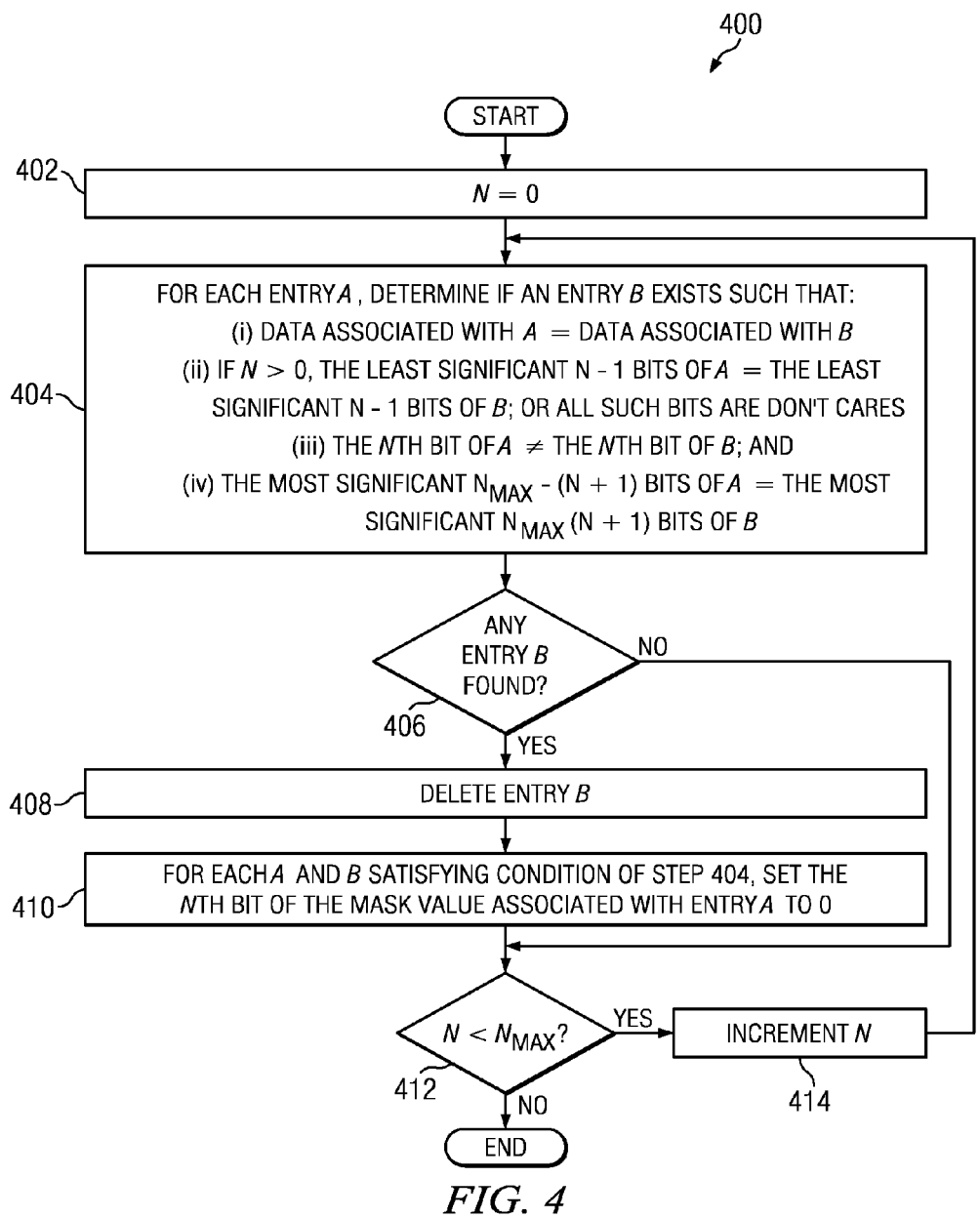
FIG. 4 illustrates a flow chart for an example method for reducing memory entries, in accordance with embodiments of the present disclosure.

FIG. 4 illustrates a flow chart for an example method 400 for reducing memory entries, in accordance with embodiments of the present disclosure. According to some embodiments, method 400 may begin at step 402. As noted above, teachings of the present disclosure may be implemented in a variety of configurations of network 10 and/or network element 102. As such, the preferred initialization point for method 400 and the order of the steps 402-414 comprising method 400 may depend on the implementation chosen.

At step 402, a processor (e.g., processor 103) or another suitable device may initialize a variable N to a value of 0. The variable N represents a bit position of interest for contents of entries in memory 300 starting from least significant bit.

At step 404, a processor (e.g., processor 103) or another suitable device may determine if there exist any pair of entries pointing to the same data (e.g. service) that can be bundled into a single entry based on data values of the entries, content values of entries at their Nth bit position, and content values of entries at bit positions more significant than their Nth bit position. For example, for each entry A of memory 300, a processor (e.g., processor 103) or another suitable device may determine if an entry B of memory 300 exists such that all of the following are true:

(i) data associated with entry A equals the data associated with entry B;
(ii) for values of N>0, the least significant N bits of A are equal to the least significant N bits of B, or all such least significant N bits of A and B are don't cares (e.g., as indicated by mask values of zero at such bit positions);
(iii) the Nth bit of A is not equal to the Nth bit of B; and
(iv) the most significant $N_{MAX}$-N bits of A are equal to the most significant $N_{MAX}$-N bits of B, where $N_{MAX}$ indicates the most-significant bit position of the contents of the entries.

In the example of FIG. 3A, two pairs of entries meet the conditions above for N=0. Entries 302 and 304 meet these conditions, as do entries 306 and 308.

At step 406, if the condition of step 404 is satisfied, method 400 may proceed to step 408. Otherwise, if the condition of step 404 is not satisfied, method 400 may proceed to step 412.

At step 408, for each entry A and entry B satisfying the condition of step 404, a processor (e.g., processor 103) or another suitable device may delete each such entry B. Thus, in the example depicted in FIG. 3A, for N=0, entries 304 and 308 may be deleted.

At step 410, for each entry A and entry B satisfying the condition of step 404, a processor (e.g., processor 103) or another suitable device may set the Nth bit of the mask value associated with entry A to 0, thus making such bit of entry A a logical don't care. In the example depicted in FIG. 3A, for N=0, the least significant bit of the mask for entries 302 and 306 may be set to 0. After completion of step 410 for N=0, an intermediate computation snapshot may appear as shown in FIG. 3B.

At step 412, a processor (e.g., processor 103) or another suitable device may determine if variable N is less than $N_{MAX}$. A value of N not less than $N_{MAX}$ would indicate that method 400 has completely executed for all possible values of N. If N is less than $N_{MAX}$, method 400 may proceed to step 414. Otherwise, if N is not less than $N_{MAX}$, method 400 may end.

At step 414, a processor (e.g., processor 103) or another suitable device may increment the variable N (e.g., increase N by 1). After completion of step 414, method 400 may proceed again to step 404, such that another iteration of steps 404 to 410 may occur.

For example, during a second iteration of steps 404-410 in which N=1, entries 302 and 306 in FIG. 3B may meet the condition of step 404. Accordingly, for N=1, entry 306 may be deleted at step 408 and the second least significant bit (i.e. N=1) of the mask value associated with entry 302 may be set to 0 at step 410. After completion of step 410 for N=1, the example intermediate snapshot of FIG. 3B may be modified to as shown in FIG. 3C.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using network element 102 or any other system operable to implement method 400. In certain embodiments, method 400 may be implemented partially or fully in software and/or firmware embodied in a memory or other computer-readable media (e.g., memory 105) and executable by a processor or other suitable device (e.g. processor 103).

A component of network 10 and/or a network element 102 may include an interface, logic, memory, and/or other suitable element. An interface receives input, sends output, processes the input and/or output, and/or performs other suitable operations. An interface may comprise hardware and/or software.

Logic performs the operations of the component, for example, executes instructions to generate output from input. Logic may include hardware, software, and/or other logic. Logic may be encoded in one or more tangible computer readable storage media and may perform operations when executed by a computer. Certain logic, such as a processor, may manage the operation of a component. Examples of a processor include one or more computers, one or more microprocessors, one or more applications, and/or other logic.

A memory stores information. A memory may comprise one or more tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Modifications, additions, or omissions may be made to network 10 and/or a network element 102 without departing from the scope of the invention. The components of network 10 and/or network element 102 may be integrated or separated. Moreover, the operations of network 10 and/or network element 102 may be performed by more, fewer, or other components. Additionally, operations of network 10 and/or a network element 102 may be performed using any suitable logic. As used in this document, "each" refers to each member of a set or each member of a subset of a set.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method for reducing memory entries in a ternary content-addressable memory, comprising:
    determining if a first entry and a second entry of the ternary content-addressable memory include the same data value, each of the entries comprising an identifier, a mask associated with the identifier, and the data value associated with the identifier;
    determining if the first entry can be masked such that searching the memory with the content value of either of the first entry or the second entry returns the same data value; and
    in response to determining that the first entry and a second entry are associated with the same data value and determining that the first entry can be masked such that searching the memory with the content value of either of the first entry or the second entry returns the same data value:
        masking the first entry such that searching the memory with the content value of either of the first entry or the second entry returns the same data value; and
        deleting the second entry.

2. A method according to claim 1, wherein:
    determining if the first entry can be masked such that searching the memory with a content value of either of the first entry or the second entry returns the same data value comprises determining if, for a particular bit position of a content value and a mask of the first entry and a content value and a mask of the second entry:
        a content value of a portion of the first entry of lesser significance than the particular bit position and a content value of a portion of the second entry of lesser significance than the particular bit position are equal to each other or each of such portion of the first entry and such portion of the second entry entirely comprise logical don't cares; and
        a value of a bit at the particular bit position of the content value of the first entry is not equal to a value of a bit at the particular bit position of the content value of the second entry; and
        a content value of a portion of the first entry of greater significance than the particular bit position and a content value of a portion of the second entry of greater significance than the particular bit position are equal to each other; and
    masking the first entry such that searching the memory with the content value of either of the first entry or the second entry returns the same data value comprises setting a bit at the particular bit position of the mask of the first entry to mask a bit at the particular bit position of the content value of the first entry.

3. A method according to claim 2, wherein the content value of the first entry and the content value of the second entry each comprise a virtual local area network identifier.

4. A method according to claim 1, wherein the data value of the first entry and the data value of the second entry each identify a service.

5. A network element comprising:
    one or more network interfaces, each network interface having one or more ports configured interface the network element to one or more other network elements; and
    a switching element communicatively coupled to the one or more network interfaces, the switching element comprising:
        a lookup table in the form of ternary content-addressable memory associating content values with respective data values; and
        a processor communicatively coupled to the memory and configured to:
            determine if a first entry and a second entry of the ternary content-addressable memory include the same data value, each of the entries comprising an identifier, a mask associated with the identifier, and the data value associated with the identifier;
            determine if the first entry can be masked such that searching the lookup table with the content value of either of the first entry or the second entry returns the same data value; and
            in response to determining that the first entry and a second entry are associated with the same data value and determining that the first entry can be masked such that addressing the memory with the content value of either of the first entry or the second entry returns the same data value:
                masking the first entry such that addressing the lookup table with the content value of either of the first entry or the second entry returns the same data value; and
                deleting the second entry.

6. A network element according to claim 5, the processor further configured to:
    in order to determine if the first entry can be masked such that searching the lookup table with a content value of either of the first entry or the second entry returns the same data value, determine if, for a particular bit position of a content value and a mask of the first entry and a content value and a mask of the second entry:
        a content value of a portion of the first entry of lesser significance than the particular bit position and a content value of a portion of the second entry of lesser significance than the particular bit position are either equal to each other or each of such portion of the first entry and such portion of the second entry entirely comprise logical don't cares; and
        a value of a bit at the particular bit position of the content value of the first entry is not equal to a value of a bit at the particular bit position of the content value of the second entry; and
        a content value of a portion of the first entry of greater significance than the particular bit position and a content value of a portion of the second entry of greater significance than the particular bit position are equal to each other; and
    in order to mask the first entry such that searching the lookup table with the content value of either of the first entry or the second entry returns the same data value, set a bit at the particular bit position of the mask of the first entry to mask a bit at the particular bit position of the content value of the first entry.

7. A network element according to claim 6, wherein the content value of the first entry and the content value of the second entry each comprise a virtual local area network identifier.

8. A network element according to claim 5, wherein the data value of the first entry and the data value of the second entry each identify a service.

9. A system comprising:
- a ternary content-addressable memory associating content values with respective data values; and
- a processor communicatively coupled to the memory and configured to:
    - determine if a first entry and a second entry of the ternary content-addressable memory include the same data value, each of the entries comprising an identifier, a mask associated with the identifier, and the data value associated with the identifier;
    - determine if the first entry can be masked such that searching the memory with the content value of either of the first entry or the second entry returns the same data value; and
    - in response to determining that the first entry and a second entry are associated with the same data value and determining that the first entry can be masked such that searching the memory with the content value of either of the first entry or the second entry returns the same data value:
        - masking the first entry such that addressing the memory with the content value of either of the first entry or the second entry returns the same data value; and
        - deleting the second entry.

10. A system according to claim 9, the processor further configured to:
    in order to determine if the first entry can be masked such that searching memory with a content value of either of the first entry or the second entry returns the same data value, determine if, for a particular bit position of a content value and a mask of the first entry and a content value and a mask of the second entry:
    - a content value of a portion of the first entry of lesser significance than the particular bit position and a content value of a portion of the second entry of lesser significance than the particular bit position are either equal to each other or each of such portion of the first entry and such portion of the second entry entirely comprise logical don't cares; and
    - a value of a bit at the particular bit position of the content value of the first entry is not equal to a value of a bit at the particular bit position of the content value of the second entry; and
    - a content value of a portion of the first entry of greater significance than the particular bit position and a content value of a portion of the second entry of greater significance than the particular bit position are equal to each other; and in order to mask the first entry such that addressing the memory with the content value of either of the first entry or the second entry returns the same data value, set a bit at the particular bit position of the mask of the first entry to mask a bit at the particular bit position of the content value of the first entry.

11. A system according to claim 10, wherein the content value of the first entry and the content value of the second entry each comprise a virtual local area network identifier.

12. A system according to claim 9, wherein the data value of the first entry and the data value of the second entry each identify a service.

* * * * *